(12) United States Patent  (10) Patent No.: US 8,956,964 B2
Wang et al.  (45) Date of Patent: Feb. 17, 2015

(54) SEMICONDUCTOR DEVICE AND FABRICATION METHOD

(71) Applicant: Semiconductor Manufacturing International (Shanghai) Corporation, Shanghai (CN)

(72) Inventors: Xinpeng Wang, Shanghai (CN); Steven Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/077,495

(22) Filed: Nov. 12, 2013

(65) Prior Publication Data

US 2014/0191314 A1 Jul. 10, 2014

(30) Foreign Application Priority Data

Jan. 8, 2013 (CN) .......................... 2013 1 0006387

(51) Int. Cl.
*H01L 21/3205* (2006.01)
*H01L 29/66* (2006.01)
*H01L 29/78* (2006.01)

(52) U.S. Cl.
CPC ........ *H01L 29/6681* (2013.01); *H01L 21/3205* (2013.01); *H01L 29/785* (2013.01)
USPC .................... 438/585; 438/197; 257/E21.409

(58) Field of Classification Search
USPC ........ 257/E21.014, E21.015, E21.4, E21.435
See application file for complete search history.

(56) References Cited

U.S. PATENT DOCUMENTS

2006/0223302 A1  10/2006 Chang et al.
2013/0214357 A1*  8/2013 Chang et al. .................. 257/347

* cited by examiner

*Primary Examiner* — Cheung Lee
(74) *Attorney, Agent, or Firm* — Anova Law Group, PLLC

(57) ABSTRACT

Semiconductor devices and fabrication methods are provided. A fin can be formed on a semiconductor substrate, a gate can be formed across the fin, and sidewall spacers can be formed across the fin on both sides of the gate. A dummy contact can be formed across the fin and on each of the both sides of the sidewall spacers. After forming an interlayer dielectric layer on the semiconductor substrate, the dummy contact can be removed to form a contact trench. The dummy contact is made of a material having an etch selectivity sufficiently higher than the fin such that the removing of the dummy contact generates substantially no damage to the fin. A conductive material can be filled in the contact trench to form a trench metal contact.

19 Claims, 6 Drawing Sheets

SEMICONDUCTOR DEVICE AND FABRICATION METHOD

CROSS-REFERENCES TO RELATED APPLICATIONS

This application claims the priority to Chinese Patent Application No. CN201310006387.7, filed on Jan. 8, 2013, which is incorporated herein by reference in its entirety.

FIELD OF THE DISCLOSURE

The present disclosure generally relates to the field of semiconductor technology and, more particularly, relates to a semiconductor device and a method for forming the semiconductor device.

BACKGROUND

When forming a fin field effect transistor (fin-FET), contact plugs can be formed on the source, drain and/or gate of the transistor. The contact plugs may connect the source, drain, and/or the gate with peripheral metal wiring layer.

FIG. 1 depicts a conventional method for forming a contact plug of a fin field effect transistor. As shown in FIG. 1, a fin 101, a gate 102 across the fin 101, sidewall spacers 103 across the fin 101 and on both sides of the gate 102, a source 111 on one side of the fin 101 and a drain 121 on the other side of the fin 101.

In FIG. 2, an interlayer dielectric layer 104 is formed to cover the semiconductor substrate 100 and the fin 101. The interlayer dielectric layer 104 has a top surface leveled with the gate 102. As shown in FIGS. 2-3, a portion of the interlayer dielectric layer 121 on the source 111 and the drain 121 is removed to form a groove 105 to expose the source 111 and to form a groove 106 to expose the drain 121.

In FIGS. 3-4, tungsten is filled in the trench 105 and the trench 106 to form a contact plug 107 across the fin 101 and on the source 111 and to form a contact plug 108 across the fin 101 and on the drain 121.

However, contact plugs formed by conventional technologies may not provide desired device performance of the resultant semiconductor device. It is therefore desirable to provide a semiconductor device and a method for forming the semiconductor device with improved device performance.

BRIEF SUMMARY OF THE DISCLOSURE

One aspect of the present disclosure includes a method of fabricating a semiconductor device. A fin can be formed on a semiconductor substrate, a dummy gate can be formed across the fin, and sidewall spacers can be formed across the fin on both sides of the dummy gate. A source and a drain can be formed by an ion implantation in the semiconductor substrate and in the fin that are on both sides of the sidewall spacers. After forming the source and the drain, a dummy contact can be formed across the fin and on each of the both sides of the sidewall spacers. After forming the dummy contact, an interlayer dielectric layer can be formed on the semiconductor substrate. The dummy gate and the dummy contact can then be exposed in a same polishing process of the interlayer dielectric layer. The dummy gate can be removed to form a metal gate across the fin. The dummy contact can be removed to form a contact trench. The dummy contact is made of a material having an etch selectivity sufficiently higher than the fin such that the removing of the dummy contact generates substantially no damage to the fin. A conductive material can be filled in the contact trench to form a trench metal contact. The trench metal contact is formed across the fin, connecting to the source or the drain, and on each of the both sides of the sidewall spacers.

Another aspect of the present disclosure also includes a method of fabricating a semiconductor device. A fin can be formed on the semiconductor substrate. A metal gate can be formed across the fin, and sidewall spacers can be formed across the fin on both sides of the metal gate. A source and a drain can be formed by an ion implantation in the semiconductor substrate and in the fin that are on both sides of the sidewall spacers. A dummy contact can be formed across the fin and on each of the both sides of the sidewall spacers, after forming the source and the drain. An interlayer dielectric layer can be formed on the semiconductor substrate, after forming the dummy contact. The dummy contact can then be removed to form a contact trench. The dummy contact is made of a material having an etch selectivity sufficiently higher than the fin such that the removing of the dummy contact generates substantially no damage to the fin. A conductive material can be used to fill the contact trench to form a trench metal contact formed across the fin, connecting to the source or the drain, and on each of the both sides of the sidewall spacers.

Another aspect of the present disclosure includes a semiconductor device. The semiconductor device can include a fin disposed on a semiconductor substrate, a gate disposed across the fin, and sidewall spacers disposed across the fin on both sides of the gate. A source and a drain can be disposed in the semiconductor substrate and in the fin that are on both sides of the sidewall spacers. A contact plug can be formed across the fin and on each of the both sides of the sidewall spacers. The contact plug can be formed by forming a dummy contact across the fin and on each of the both sides of the sidewall spacers after formation of the source and the drain. An interlayer dielectric layer can be formed on the semiconductor substrate after the dummy contact is formed. The dummy contact can be removed to form a contact trench after forming the interlayer dielectric layer. The dummy contact is made of a material having an etch selectivity sufficiently higher than the fin such that the removing of the dummy contact generates substantially no damage to the fin. A conductive material can be filled in the contact trench to form a contact plug. The contact plug is formed across the fin and on each of the both sides of the sidewall spacers.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
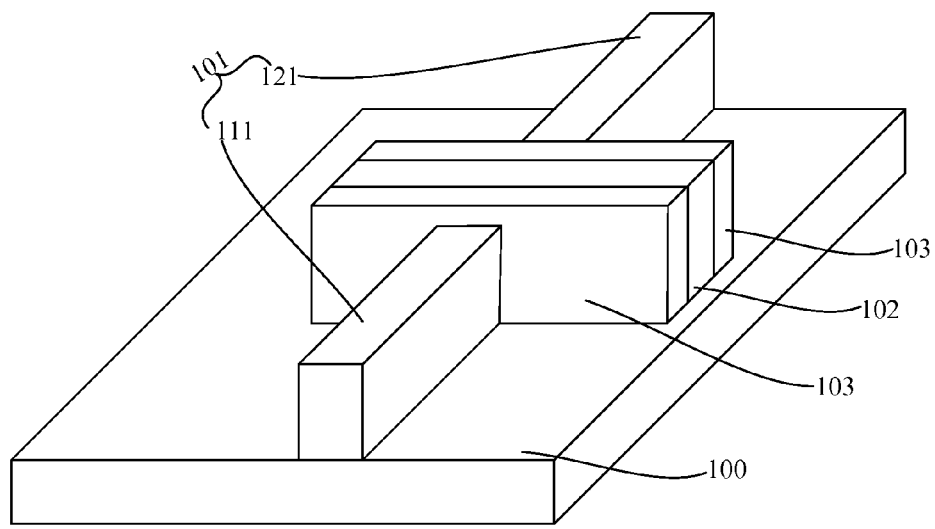
FIGS. 1-4 depict a conventional method for forming a contact plug in a fin field effect transistor.
Figure 2:
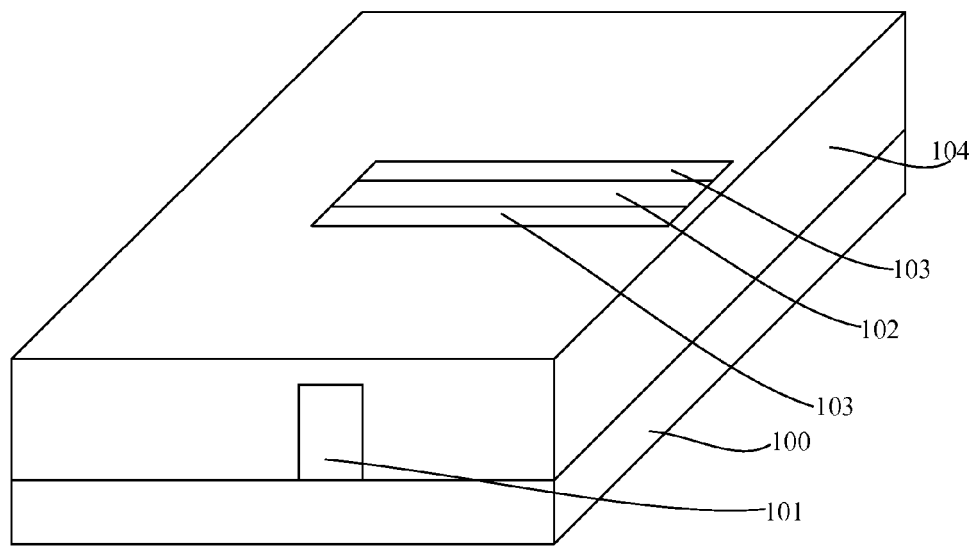
Figure 3:
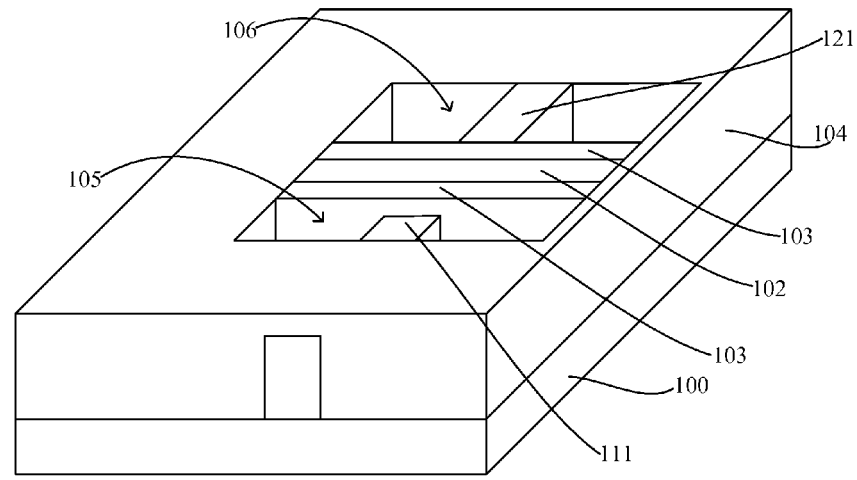
Figure 4:
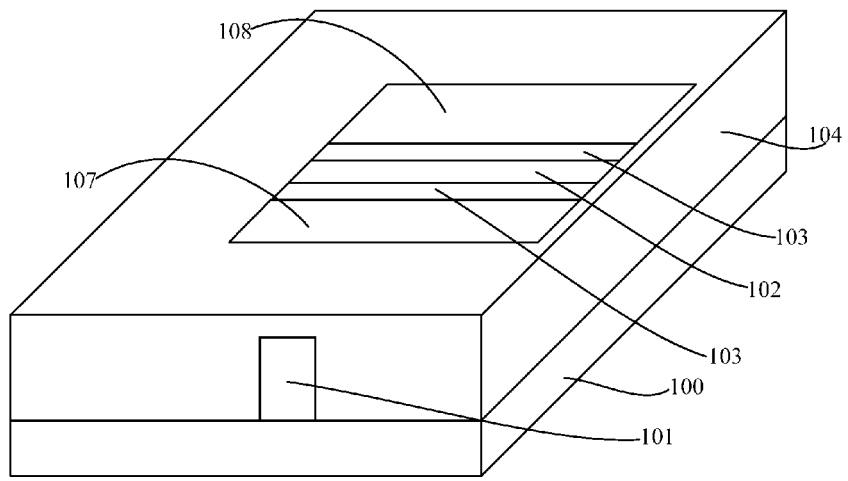

Referring back to FIGS. 2-3, when a portion of the interlayer dielectric layer 121 on the source 111 and the drain 121 is removed to expose the source 111 and to expose the drain 121, a dry etching process is usually selected and used. However, when using the dry etching to remove the interlayer dielectric layer, a portion of the fin may also be etched away to damage the fin. Because the fin on both sides of sidewall spacer is used as the source and the drain, the fin damage may cause the source and drain with unsatisfied shape, composition, dimensions, and/or other parameters, which may adversely affect device performance of the resultant semiconductor device.

Figure 5:
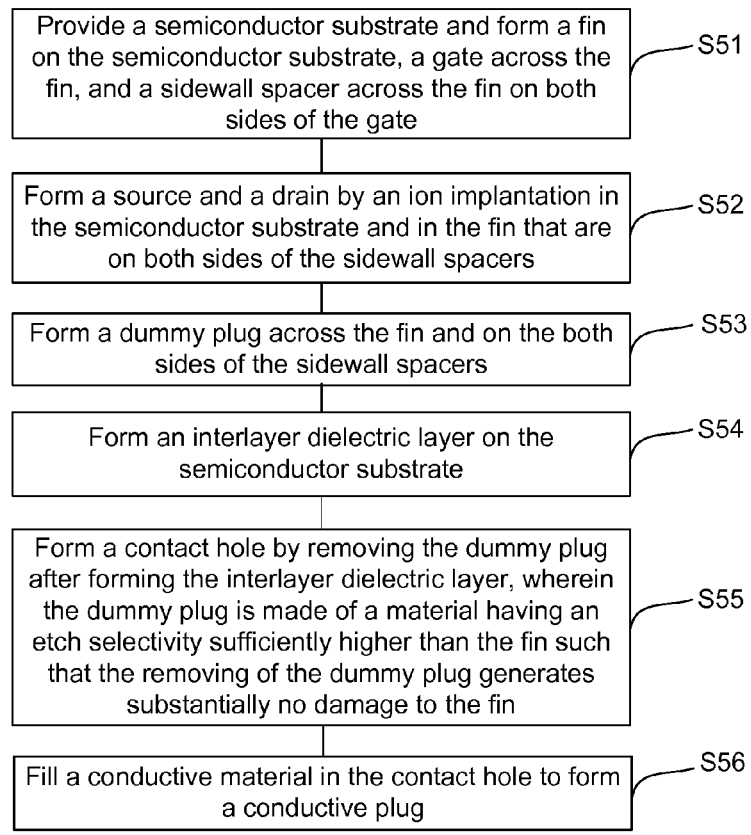
FIG. 5 depicts an exemplary method for forming a semiconductor device in accordance with various disclosed embodiments.

FIG. 5 depicts an exemplary method for forming a semiconductor device, while FIGS. 6-11 depict an exemplary semiconductor device at various stages during its formation in accordance with various disclosed embodiments.

Figure 6:
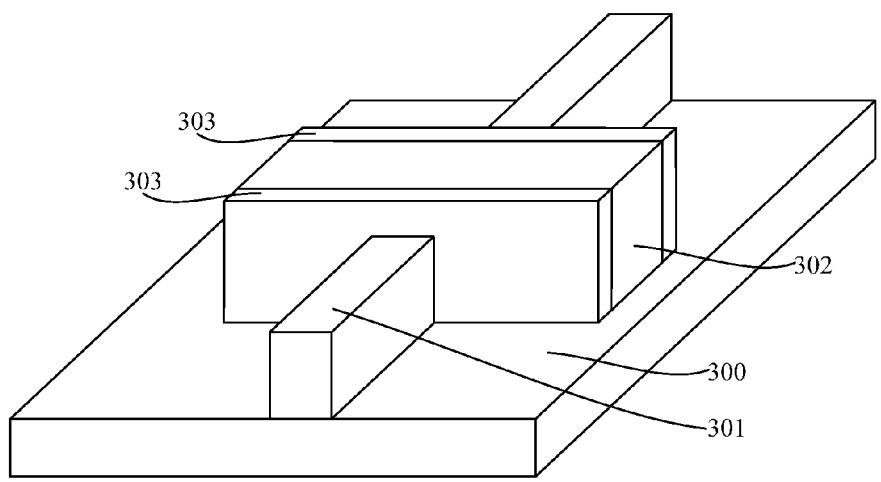
FIGS. 6-9 and 11 depict a perspective view of an exemplary semiconductor device at various stages during its formation in accordance with various disclosed embodiments.

In Step S51 of FIG. 5 and referring to FIG. 6, a semiconductor substrate 300 is provided. On the semiconductor substrate 300, a fin 301, a gate 302 across the fin 301, and a sidewall spacer 303 across the fin 301 on both sides of the gate 302 are formed.

In a certain embodiment, a silicon-on-insulator (SOI) can be selected for the semiconductor substrate 300. An SOI can include an insulating layer sandwiched between a top silicon layer and a bottom silicon layer. The top silicon layer can be used to form the fin 301. The insulating layer can provide electrical insulation between semiconductor devices formed on the semiconductor substrate 300. Therefore, the fin 301 can be disposed on the insulating layer of the semiconductor substrate 300, although for illustration purposes, the insulating layer is not shown in FIG. 6.

In a specific embodiment, the fin 301 can be formed by, for example, forming a patterned mask layer on a top silicon layer. The patterned mask layer can define a position of the fin to be formed. The patterned mask layer can be used as an etch mask to etch the top silicon layer to expose the insulating layer after etching. The patterned mask layer can then be removed to form the fin 301 on the insulating layer.

In some embodiments, after forming the fin 301, a gate dielectric layer (not shown) can be formed across the fin 301, and a gate 302 can be formed on the gate dielectric layer. In other embodiments, the gate 302 can be a dummy gate. The dummy gate can be formed by a material including polysilicon, amorphous silicon, and/or other suitable materials.

After forming the gate 302, the sidewall spacers 303 can be formed on both sides of the gate 302 and across the fin 301. The sidewall spacers 303 can define a source to be formed, and a distance between a drain and a gate 302. In addition, the sidewall spacers 303 can be used as an isolation layer between contact plugs, formed on the subsequently formed source and drain, and the gate 302. In a specific embodiment, the sidewall spacers 303 can be formed by, for example, depositing a dielectric layer to cover the semiconductor substrate 300, the fin 301, and the gate 302; etching back the dielectric layer to leave a remaining dielectric layer on both sides of the gate 302 to form the sidewall spacers 303. The sidewall spacers 303 can be formed of a material including silicon nitride, silicon oxide, and/or silicon oxynitride. The sidewall spacers 303 can have a single layer structure or a multiple layer structure having stacked multi-layers.

In Step S52 of FIG. 5 and referring to FIG. 6, an ion implantation can be performed in the semiconductor substrate 300 and in the fin 301 on both sides of the sidewall spacers 303 to form the source and drain (not shown). The fin 301 on both sides of the sidewall spacers 303 can be a portion of the source and the drain.

In a particular embodiment, the ion type for the ion implantation to form the source and drain can be determined by the type of the semiconductor device, e.g., the fin field effect transistor, to be formed. For example, when the transistor to be formed is a p-type transistor, the p-type ions including, e.g., boron, and/or other pentavalent element(s), can be implanted. When the transistor to be formed is an n-type transistor, the n-type ions including, e.g., phosphorus, arsenic, and/or other trivalent element(s) can be implanted.

Figure 7:
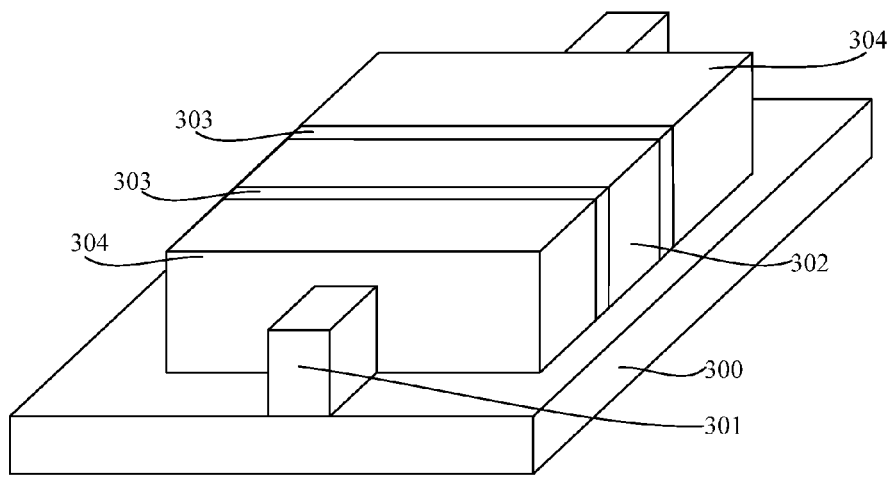

In Step S53 of FIG. 5 and referring to FIG. 7, after forming the source and the drain, a dummy contact 304 is formed across the fin 301 on both sides of the sidewall spacers 303. In a particular embodiment, the dummy contact 304 is formed across the fin 301 which is used as a source or a drain. The dummy contact 304 can also define a position of a contact plug subsequently formed on each of the source and drain.

The dummy contact 304 can be formed of a material including, e.g., a photoresist, an advanced patterning film (APF), and/or a bottom antireflective layer. Exemplary APF can include amorphous carbon. The dummy contact 304 can be formed of a material selected such that the dummy contact can have an etch selectivity sufficiently high over the fin (e.g., made of silicon) and when the dummy contact is removed, substantially no damages can occur to the fin material. For example, the dummy contact 304 can be formed by a method including: depositing a dummy contact material to cover the semiconductor substrate 300, the fin 301, the gate 302 and the sidewall spacers 303; and etching back the dummy contact material to form the dummy contact 304 across the fin 301 on both sides of the sidewall spacers 303.

In a particular embodiment, prior to forming the dummy contact 304, an etch stop layer (not shown) can be formed across the fin. The etch stop layer can be used as a barrier or a protection layer to protect the fin when forming the dummy contact on the fin such that the fin may not be adversely affected. The etch stop layer may also be used as a stop layer when subsequently removing the dummy contact. Generally, the etch stop layer can be made of a material including, e.g., silicon nitride.

Figure 8:
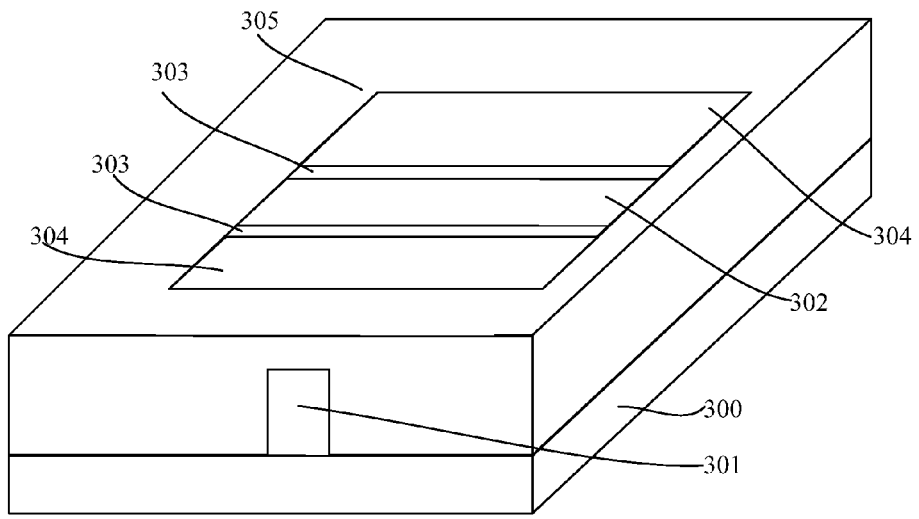

In Step S54 of FIG. 5 and referring to FIG. 8, after forming the dummy contact 304, an interlayer dielectric layer 305 is formed on the semiconductor substrate 300. At this point, the dummy contact 304 is located in the interlayer dielectric layer 305. The interlayer dielectric layer 305 can surround the dummy contact 304.

The interlayer dielectric layer 305 can be formed by a method including, for example, depositing a dielectric layer to cover the semiconductor substrate 300, the fin 301, the gate 302, the sidewall spacers 303, and the dummy contact 304; using a chemical mechanical polishing or an etching back process to level a top surface of the interlayer dielectric layer 305 with a top surface of the gate 302. When a hard mask layer is formed on the gate 302, the interlayer dielectric layer 305 can have a top surface leveled with a top surface of the and hard mask layer (not shown). The interlayer dielectric layer 305 can be made of a material including, e.g., silicon oxide.

In other embodiments where the gate 302 is a dummy gate, immediately after forming the interlayer dielectric layer 305, the dummy gate can be removed to form a groove. For example, the dummy gate can be removed by a dry etching process, followed by using a wet etching process to remove polymer residues, e.g., formed on sidewalls and bottom of the groove during the dry etching process.

After forming the groove, a high K dielectric layer can be formed in the groove and a gate can be formed on the high-K dielectric layer. For example, a gate material and a high-K dielectric material can be deposited to cover the interlayer dielectric layer 305 and to fill the groove. Each portion of the gate material and the high-K dielectric material that is formed above the interlayer dielectric layer 305 can be removed to leave the high-K dielectric material and the gate material in the groove to form the high-K gate dielectric layer and the gate on the high-K gate dielectric layer. Such removal can be performed, e.g., by a chemical mechanical polishing (CMP) or an etching back process.

The gate can be formed by the gate material including a metal or any suitable conductive materials. Exemplary metal can include Al, Cu, Ag, Au, Pt, Ni, Ti, TiN, TaN, Ta, TaC, TaSiN, W, WN, WSi, or a combination thereof. The high-K gate dielectric layer can be formed by the high-K gate dielectric material including, e.g., chromium oxide, zirconium oxide, and/or any other suitable materials.

Figure 9:
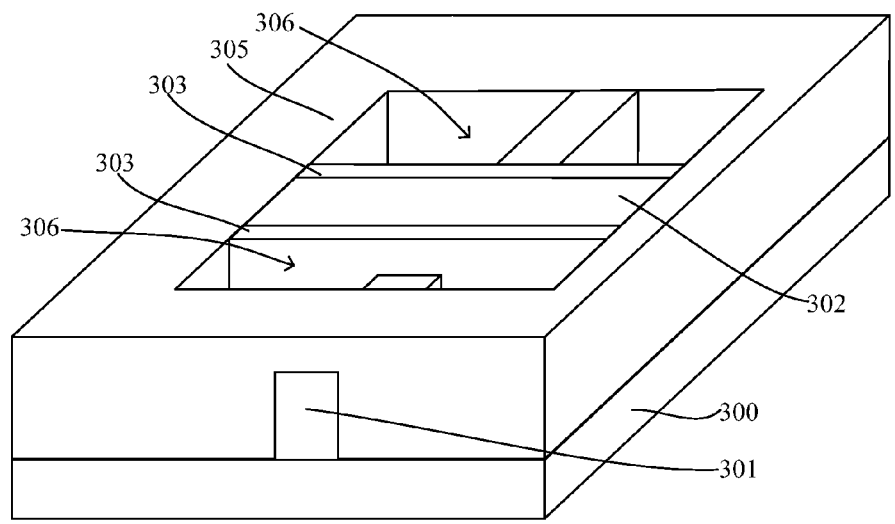
Figure 10:
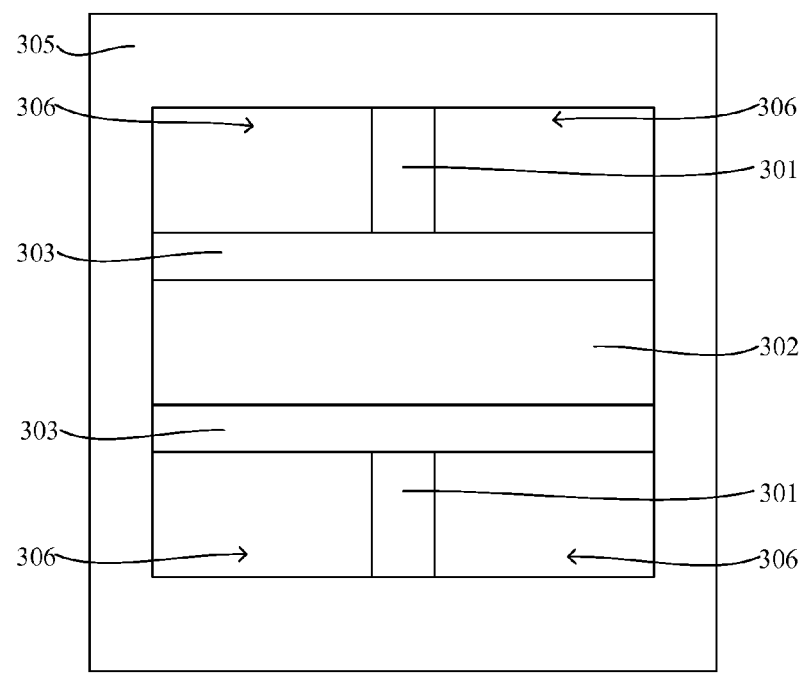
FIG. 10 depicts a top view of the exemplary semiconductor device shown in FIG. 9 in accordance with various disclosed embodiments.

FIG. 9 is a perspective view of the exemplary semiconductor device, while FIG. 10 depicts a top view of the semiconductor device shown in FIG. 9.

In Step S55 of FIG. 5, and referring to FIGS. 9-10, after forming the interlayer dielectric layer 305, the dummy contact 304 is removed to form a contact trench 306. The dummy contact 304 can have an etch selectivity sufficiently high over the fin 301 such that substantially no damage can occur to the fin 301 when removing the dummy contact 304.

In a particular embodiment, the dummy contact 304 can be removed by, for example, forming a patterned mask layer on the interlayer dielectric layer 305 to cover the gate 302 and the sidewall spacers 303 and to define the position of dummy contact 304; using the patterned mask layer as an etch mask to remove the dummy contact 304 by a dry etching process to form a contact trench 306; and removing the patterned mask layer.

When using the dry etching process to remove the dummy contact, an etching gas introduced into a reaction chamber can include, e.g., $N_2$, $H_2$, $SO_2$, CO, $CO_2$, $O_2$, or a combination thereof. The dummy contact 304 can be formed of a material including photoresist, non-amorphous carbon, or a bottom anti-reflective layer. The use of above depicted etching gas(es) can provide the dummy contact 304 an etching selectivity sufficiently higher than the fin 301. Then, in the dry etching process, the dummy contact 304 can be guaranteed to be removed completely, and the dry etching process can be stopped at the top surface of the fin 301 with substantially no damage to the fin 301.

In this manner, the portion of the fin that is used as the source and the drain can be substantially no damages. Further, the source and the drain are maintained in such a complete form, the source and drain can have composition, shape and/or other parameters as designed. The resultant semiconductor device can have desired device performance.

In a particular embodiment, when an etch stop layer is formed underneath the dummy contact 304, the etch stop layer can be removed by continuing the etching process after the dummy contact 304 is removed by the dry etching process.

Figure 11:
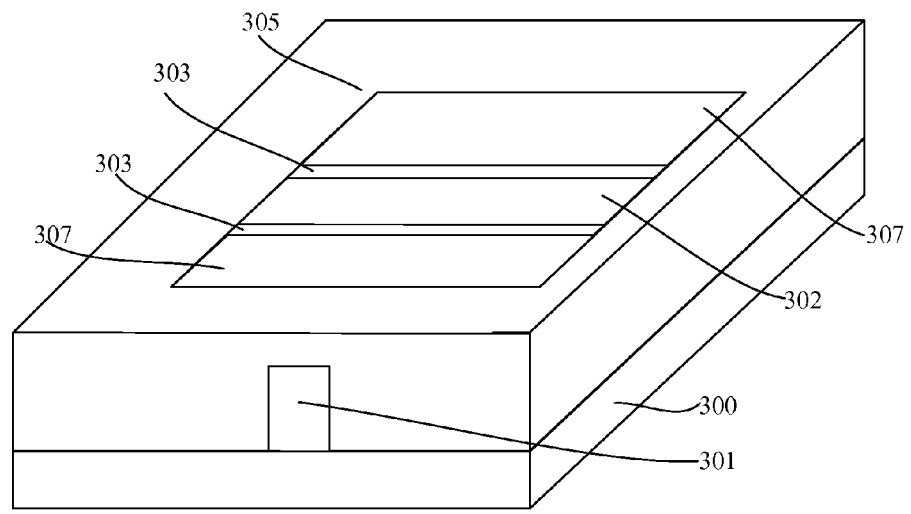

In Step S56 of FIG. 5, and referring to FIGS. 9 and 11, a trench metal contact 307 is formed by filling the contact trenchs 306 with a conductive material.

The trench metal contact 307 can be formed by, for example, depositing the conductive material on the interlayer dielectric layer and fill the contact trench 306; removing a portion of the conductive material that is above the interlayer dielectric layer to have a remaining conductive material in the contact trench to form the trench metal contact 307. Specifically, the conductive material can be removed from the interlayer dielectric layer by a chemical mechanical polishing (CMP) process or an etching back process. The conductive material can be selected and made of aluminum (Al) and/or tungsten (W).

In a particular embodiment, prior to forming the trench metal contact 307 in the contact trench 306, a metal silicide (not shown) can be formed on the bottom of the contact trench 306 and across the fin 301. The metal silicide can be nickel silicide or cobalt silicide. The metal silicide can reduce contact resistance between the contact plugs (formed on the source or the drain) and the underlying source (or drain). Signal transmission between the semiconductor devices can thus be more sensitive.

In a particular embodiment, prior to filling the contact trench 306 with the conductive material to form the trench metal contact 307, a backing layer (not shown) can be formed on the sidewall and the bottom of the contact trench 306. In other embodiments when a metal silicide layer is formed on the bottom of the contact trench 306, the backing layer can be formed on the sidewall of the contact trench 306.

The backing layer can prevent the conductive material from being diffused from the contact trenchs 306 into adjacent interlayer dielectric layer 305 and/or the fin 301. If such diffusion does not have a negative effect on the semiconductor device, the backing layer may not need to be formed. In various embodiments, the backing layer can be made of a material including titanium nitride (TiN) and/or tantalum nitride (TaN).

As shown in FIG. 5, performing Steps S51-S55 can form the contact plug across the fin and on each of the source and the drain. The gate can be a metal gate or other suitable gate material. In a particular embodiment, in addition to forming the trench metal contact on each of the source and the drain, additional electrical contact can be formed on the metal gate as a gate contact. When forming a gate contact, a contact plug can also be formed on the trench metal contact in a same process. For example, following Step S55 (referring to FIGS. 9-10), a dielectric layer can be formed to cover the interlayer dielectric layer, the metal gate, and the sidewall spacers. A patterned mask layer can be formed on the dielectric layer to define the position of the metal gate and a position of the trench metal contact. The patterned mask layer can be used as an etch mask to etch the dielectric layer to form a contact hole on each of the metal gate and the trench metal contact. The etching of the dielectric layer stops at a surface of the metal gate and the trench metal contact. Conductive material can be filled in the contact hole on the metal gate and on the trench metal contact to form the gate contact and the contract plug connecting the trench metal contact.

The disclosed process can include a gate last process. Referring to FIG. 6, after forming the trench metal contact 307 on each of the source and the drain, additional contact plugs can be formed on, e.g., a metal gate (e.g., a metal gate on a high-K dielectric layer) formed after a dummy gate is removed. For example, the method can include: exposing the dummy gate and the dummy contact in a same polishing process of the interlayer dielectric layer; removing the dummy gate to form the metal gate across the fin; removing the dummy contact to form a contact trench; and filling a conductive material in the contact trench to form the trench metal contact across the fin, connecting to the source or the drain, and on each of the both sides of the sidewall spacers. In some cases, a gate contact and a contact plug connecting the trench metal contact can be formed in a same process as discussed above.

Other applications, advantages, alternations, modifications, or equivalents to the disclosed embodiments are obvious to those skilled in the art.

What is claimed is:

1. A method of fabricating a semiconductor device, comprising:
   providing a semiconductor substrate;
   forming a fin on the semiconductor substrate, a dummy gate across the fin, and sidewall spacers across the fin on both sides of the dummy gate;
   forming a source and a drain by an ion implantation in the semiconductor substrate and in the fin that are on both sides of the sidewall spacers;
   forming a dummy contact across the fin and on each of the both sides of the sidewall spacers, after forming the source and the drain;
   forming an interlayer dielectric layer on the semiconductor substrate, after forming the dummy contact;
   exposing the dummy gate and the dummy contact in a same polishing process of the interlayer dielectric layer;
   removing the dummy gate to form a metal gate across the fin;
   removing the dummy contact to form a contact trench, wherein the dummy contact is made of a material having an etch selectivity sufficiently higher than the fin such that the removing of the dummy contact generates substantially no damage to the fin; and
   filling a conductive material in the contact trench to form a trench metal contact, wherein the trench metal contact is formed across the fin, connecting to the source or the drain, and on each of the both sides of the sidewall spacers.

2. The method of claim 1, wherein forming the dummy contact includes:
   depositing a dummy contact material to cover the semiconductor substrate, the fin, the gate, and the sidewall spacers; and
   etching back the dummy contact material to form the dummy contact across the fin and on the both sides of the sidewall spacers.

3. The method of claim 1, wherein the dummy contact is made of a material including amorphous carbon, photoresist, or a bottom anti-reflection material.

4. The method of claim 1, wherein removing the dummy contact to form the contact trench includes:
   forming a patterned mask layer on the interlayer dielectric layer to define a position of the dummy contact;
   using the patterned mask layer as an etch mask to remove the dummy contact by a dry etching process to form the contact trench; and
   removing the patterned mask layer.

5. The method of claim 4, wherein the dry etching process uses an etching gas in a reaction chamber, the etching gas including $N_2$, $H_2$, $SO_2$, $CO$, $CO_2$, $O_2$, or a combination thereof.

6. The method of claim 1, wherein the trench metal contact is formed in the contact trench by a process including:
   depositing the conductive material to cover the interlayer dielectric layer and to fill the contact trench; and
   removing a portion of the conductive material above the interlayer dielectric layer to have a remaining conductive material in the contact trench to form the trench metal contact.

7. The method of claim 1, further including forming a backing layer on a bottom and a sidewall of the contact trench prior to filling the conductive material in the contact trench.

8. The method of claim 7, wherein the backing layer is made of a material including titanium nitride, tantalum nitride, or a combination thereof.

9. The method of claim 1, wherein the conductive material or the trench metal contact includes aluminum, tungsten, or a combination thereof.

10. The method of claim 1, further including forming a metal silicide on a bottom of the contact trench and across the fin prior to filling the conductive material in the contact trench.

11. The method of claim 1, wherein removing the dummy gate to form the metal gate includes:
    removing the dummy gate to form a groove, prior to removing the dummy contact; and
    forming a high-K gate dielectric layer in the groove and the metal gate on the high-K gate dielectric layer.

12. The method of claim 1, wherein the metal gate includes Al, Cu, Ag, Au, Pt, Ni, Ti, TiN, TaN, Ta, TaC, TaSiN, W, WN, WSi, or a combination thereof.

13. The method of claim 1, further including forming a gate contact on the metal gate and forming a contact plug on the trench metal contact by a process including:
    forming a dielectric layer to cover the interlayer dielectric layer, the metal gate, and the trench metal contact;
    forming a patterned mask layer on the dielectric layer to define a position of the metal gate and a position of the trench metal contact;
    using the patterned mask layer as an etch mask to etch the dielectric layer to form a contact hole on each of the metal gate and the trench metal contact, wherein the etching of the dielectric layer stops at a surface of the metal gate and the trench metal contact; and
    filling a conductive material in the contact hole on the metal gate and on the trench metal contact to form the gate contact and the contract plug.

14. A method of fabricating a semiconductor device, comprising:
    providing a semiconductor substrate;
    forming a fin on the semiconductor substrate, a metal gate across the fin, and sidewall spacers across the fin on both sides of the metal gate;
    forming a source and a drain by an ion implantation in the semiconductor substrate and in the fin that are on both sides of the sidewall spacers;
    forming a dummy contact across the fin and on each of the both sides of the sidewall spacers, after forming the source and the drain;
    forming an interlayer dielectric layer on the semiconductor substrate, after forming the dummy contact;
    removing the dummy contact to form a contact trench, wherein the dummy contact is made of a material having an etch selectivity sufficiently higher than the fin such that the removing of the dummy contact generates substantially no damage to the fin; and
    filling a conductive material in the contact trench to form a trench metal contact, wherein the trench metal contact is formed across the fin, connecting to the source or the drain, and on each of the both sides of the sidewall spacers.

15. The method of claim 14, wherein removing the dummy contact to form the contact trench includes:
    forming a patterned mask layer on the interlayer dielectric layer to define a position of the dummy contact;
    using the patterned mask layer as an etch mask to remove the dummy contact by a dry etching process to form the contact trench; and
    removing the patterned mask layer.

16. The method of claim 15, wherein the dry etching process uses an etching gas in a reaction chamber, the etching gas including $N_2$, $H_2$, $SO_2$, CO, $CO_2$, $O_2$, or a combination thereof.

17. The method of claim 14, further including forming a gate contact on the metal gate and forming a contact plug on the trench metal contact by a process including:

- forming a dielectric layer to cover the interlayer dielectric layer, the gate, and the trench metal contact;
- forming a patterned mask layer on the dielectric layer to define a position of the metal gate and a position of the trench metal contact;
- using the patterned mask layer as an etch mask to etch the dielectric layer to form a contact hole on each of the metal gate and the trench metal contact, wherein the etching of the dielectric layer stops at a surface of the metal gate and the trench metal contact; and
- filling a conductive material in the contact hole on the metal gate and on the trench metal contact to form the gate contact and the contract plug.

18. A semiconductor device, comprising:

a semiconductor substrate;

a fin disposed on the semiconductor substrate, a gate across the fin on the semiconductor substrate, and sidewall spacers across the fin contacting on both sidewalls of the gate and on the semiconductor substrate;

a source and a drain disposed in the semiconductor substrate and in the fin that are on both sides of the sidewall spacers; and a trench metal contact formed across the fin on the semiconductor substrate, connecting to the source or the drain, and contacting on each of the both sidewalls of the sidewall spacers, wherein the trench metal contact includes a conductive material filled in a contact trench comprising a backing layer disposed on a bottom and a sidewall of the contact trench, wherein the conductive material is disposed on the backing layer, across the fin, and in the contact.

19. The device of claim 18, further including a metal silicide disposed on a bottom of the contact trench and across the fin, wherein the conductive material is disposed on the metal silicide and in the contact trench.

* * * * *